United States Patent [19]

Nishiura et al.

[11] Patent Number: 5,294,297
[45] Date of Patent: Mar. 15, 1994

[54] METHOD FOR PROCESSING SURFACE OF WORK ROLL

[75] Inventors: Tetsuya Nishiura; Motofumi Kurahashi; Masanori Takemoto, all of Tokai; Yoshihei Narita, Kyoto; Shigeru Hagio, Kyoto; Shinichi Uehara, Kyoto, all of Japan

[73] Assignee: Nippon Steel Corporation, Tokyo, Japan

[21] Appl. No.: 39,015

[22] PCT Filed: Jul. 30, 1992

[86] PCT No.: PCT/JP92/00964
§ 371 Date: Mar. 29, 1993
§ 102(e) Date: Mar. 29, 1993

[87] PCT Pub. No.: WO93/03199
PCT Pub. Date: Feb. 18, 1993

[30] Foreign Application Priority Data

Jul. 30, 1991 [JP] Japan ............... 3-190397

[51] Int. Cl.⁵ ............... B44C 1/22; C23F 1/00
[52] U.S. Cl. ............... 156/659.1; 156/654; 156/904; 156/905

[58] Field of Search ............... 156/654, 656, 659.1, 156/664, 905, 904; 101/3.1, 5, 6, 32; 430/296, 302, 306, 307, 310, 323, 329

[56] References Cited

U.S. PATENT DOCUMENTS 4,059,479  11/1977  Tanazawa ............... 156/640
4,959,275  9/1990  Iguchi et al. ............... 156/905 X

FOREIGN PATENT DOCUMENTS 62-11922   3/1987  Japan .
62-161868  7/1987  Japan .
2-3474     1/1990  Japan .

Primary Examiner—William A. Powell
Attorney, Agent, or Firm—Kenyon & Kenyon

[57] ABSTRACT

A method for processing the surface of a work roll, comprising forming a pattern coated with a cured product of a photosensitive resin composition on the surface of a work roll only at a predetermined portion, chemically etching the surface of the work roll at the remaining uncoated portions and peeling the cured product to form an uneven pattern on the surface of the work roll, wherein the composition comprises a visible light curable photosensitive resin composition and is cured by visible light irradiation.

5 Claims, 1 Drawing Sheet

METHOD FOR PROCESSING SURFACE OF WORK ROLL

TECHNICAL FIELD

The present invention relates to a method for processing the surface of a work roll in which the surface of a work roll is coated, at a predetermined portion, with a cured product of a photosensitive resin composition to thereby form a pattern and the surface of the work roll is chemically etched at the remaining uncoated portions and the cured product is peeled off to thereby process the surface of the work roll.

BACKGROUND ART

In general a steel plate or sheet is coated with a paint and then supplied as a product for use as a body of, for example, automobiles, an outer plate or sheet of domestic electric appliances. In recent years, not only the quality of products but also the appearance of products, which appeals to the sense of sight has become regarded as being of importance. With respect to factors having an effect on appearance, it is said that appearance is greatly influenced by the surface roughness of the steel plate or sheet, although it depends also upon the thickness of the coating.

The roughness on the surface of the steel plate or sheet is formed by transferring unevenness of the surface of the roll to the surface of the steel plate or sheet at the time of cold rolling or skin pass rolling. In order to improve this fact, Japanese Examined Patent Publication (Kokoku) No. 62-11922, for example, discloses a method for processing a roll which comprises coating the surface of a roll with an ultraviolet curing photosensitive resin to form regular marks. In this method, however, the sensitivity of the photosensitive resin is so low that an energy of several tens to several hundreds of $mJ/cm^2$ is necessary for curing the photosensitive resin. For this reason, when the photosensitive resin is cured by using an ultraviolet laser having an output of 100 W or more as an energy radiation, an exposure time of 50 msec is necessary, for example, in the case of a photosensitive film having a thickness of 7 μm, and it takes a lot of time for a fine uneven pattern to be formed on the surface of the roll, which leads to a problem of remarkably poor productivity.

Further, in the conventional ultraviolet laser device, since it is difficult to continuously ensure a stable energy at a high output for a long period of time, the use of a high performance ultraviolet laser device requiring a high equipment cost becomes necessary for continuously ensuring a stable energy at a high output for a long period of time.

DISCLOSURE OF THE INVENTION

An object of the present invention is to solve the above-mentioned problems and to provide a method for processing the surface of a work roll, which is capable of improving the surface property of the steel plate or sheet and is capable of shortening the time taken for processing the work roll and of processing the surface of the work roll by means of an inexpensive roll processing device.

In accordance with the present invention, there is provided a method for processing the surface of a work roll, comprising the steps of:

coating the surface of a work roll at a predetermined portion with a cured product of a photosensitive resin composition to form a pattern; and chemically etching the surface of the work roll at the remaining uncoated portions and peeling the cure product to process the surface of the work roll, wherein said composition comprises a visible light curable photosensitive resin composition and is cured by visible light irradiation.

As the above-mentioned composition, use is made of a visible light curable photosensitive resin composition comprising an ethylenically unsaturated compound, a radical generator and a sensitizer and optionally a binder polymer.

BRIEF DESCRIPTION OF DRAWINGS

The present invention will now be described in more detail with reference to the accompanying drawings, wherein.

BEST MODE FOR CARRYING OUT THE INVENTION

Figure 1:
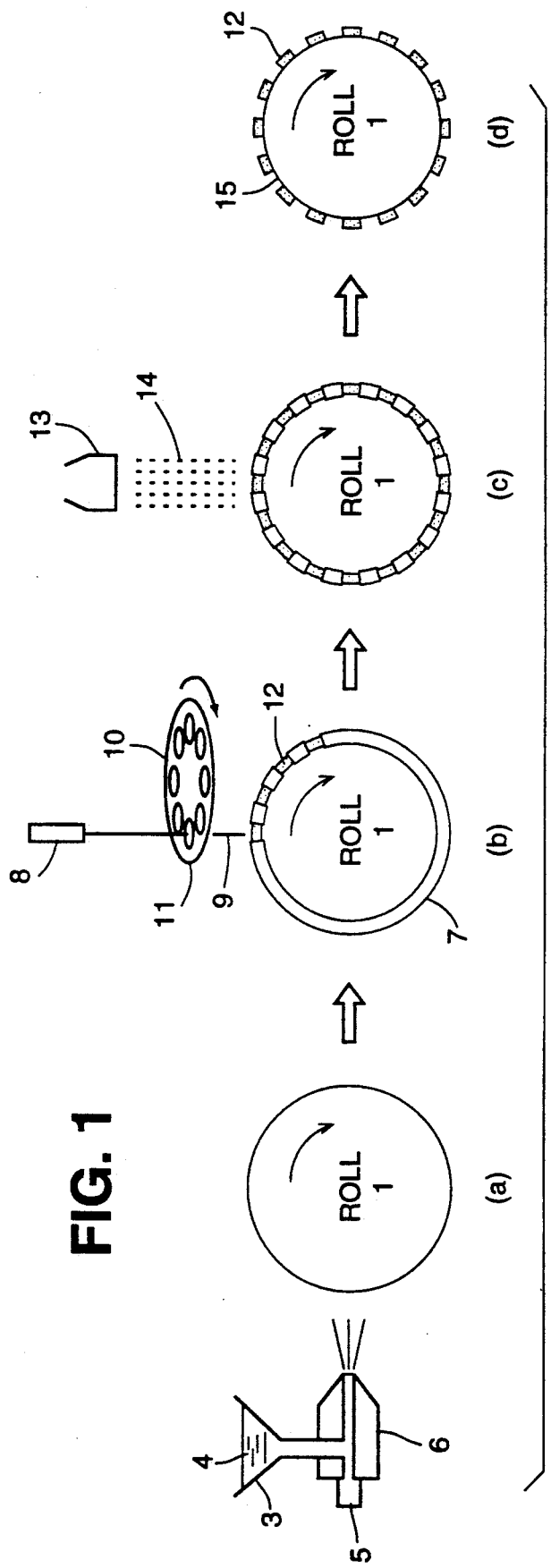
FIGS. 1 (a), (b), (c) and (d) are diagrams showing one embodiment of the processing steps for imparting unevenness according to the present invention.

The term "work roll" used in the present invention is intended to mean a roll for rolling a flat material, such as a steel plate or form, and having a cylindrical shape.

Further, the visible light curable photosensitive resin composition is a composition comprising a binder polymer, an ethylenically unsaturated compound, a radical generator and a sensitizer or a composition comprising an ethylenically unsaturated compound, a radical generator and a sensitizer.

Examples of the binder polymer include a copolymer of a (meth)acrylate (which means both an acrylate and a methacrylate) with another ethylenically unsaturated compound, polyvinyl alcohol, a butyral resin, a formal resin, a partially saponified polyvinyl acetate, a polyester resin, a polyurethane resin, a polyamide, a phenoxy resin and a phenolic resin. Among them, a copolymer of a (meth)acrylate with another ethylenically unsaturated compound is particularly preferred.

If necessary, a crosslinking component can be mixed or copolymerized with the binder polymer to improve the chemical resistance. Examples of the crosslinking component include a melamine resin, an epoxy resin, an isocyanate and a masked isocyanate. Among them, a melamine resin is particularly preferred. Examples of the crosslinkable comonomers include a vinyl monomer compound having a glycidyl group, a furfuryl group, an N-methylol group or an N-alkoxymethyl group.

Among them, a vinyl monomer having an N-methylol group is particularly preferred.

Examples of the ethylenically unsaturated compound include alkyl (meth)acrylates such as methyl (meth)acrylate, ethyl (meth)acrylate and butyl (meth)acrylate; (meth)acrylates of polyhydric alcohols or alkylene oxide adducts of polyhydric alcohols such as hydroxyethyl (meth)acrylate, neopentyl glycol di(meth)acrylate, trimethylolpropane tri(meth)acrylate and tetraethylene glycol di(meth)acrylate; polyester (meth)acrylates comprising a polyester resin having at its end an acrylate group and prepared from a polybasic acid and a polyhydric alcohol, such as Aronix (trade name) M-

1100, M-1200, M-6100 and M-7100 (manufactured by Toa Gousei Kogyo K. K.); urethane (meth)acrylates produced by reacting polyisocyanates, such as tolylene diisocyanate, isophorone diisocyanate or hexamethylene diisocyanate, with (meth)acrylates having an active hydrogen group, such as a hydroxyl group, a carboxyl group or an imino group; epoxy (meth)acrylates produced by reacting polyfunctional epoxy resins, such as bisphenol A diglycidyl ether, isocyanuric acid triglycidyl ether or pentaerythritol triglycidyl ether, with (meth)acrylates; styrene compounds; and unsaturated polyester resins. Further, use may be made of a mixture of the above-mentioned ethylenically unsaturated compounds. Among them, (meth)acrylates of polyhydric alcohols or alkylene oxide adducts of polyhydric alcohols, urethane (meth)acrylate and epoxy(meth)acrylate are particularly preferred.

Examples of the radical generators include benzophenones such as benzophenone, 4,4'-bis(dimethylamino)-benzophenone and 4-morpholibenzophenone, alkyl aryl ketones such as benzyl methyl ketal, 2,2-diethoxyacetophenone, 2-hydroxy-2-methylpropiophenone, 1-hydroxycyclohexyl phenyl ketone and isopropyl benzoyl ether, s-triazines such as 2,4,6-tris(trichloromethyl)-s-triazine, N-phenylglycines such as N-phenylglycine and N-(p-chloro)-phenylglycine, and organic peroxides such as 3,3',4,4'-tetra(tertbutylperoxycarbonyl)-benzophenone and di-(tertbutylperoxy)phthalate. The above-mentioned radical generators may be used also in the form of a mixture thereof. Among these, N-phenylglycines and organic peroxides are particularly preferred.

Examples of the sensitizer include coumarins such as 3,3'-carbonylbis(7-diethylaminocoumarin), 3-acetyl-7-dimethylaminocoumarin, cyanine dyes such as 1,1-bis(3-ethyl-2-α-naphthothiazole)methinecyanine and 1,1-bis-(3-ethyl-3-benzothiazole)methinecyanine and xanthone dyes such as 2-methylthioxanthone and 2,4-dimethylxanthone. The above-described sensitizers may be used also in the form of a mixture thereof. Among them, coumarins are particularly preferred.

In the present invention, the visible light curable photosensitive resin composition may be preferably a composition comprising (a) 5 to 80% by weight, more preferably 15 to 60% by weight of a binder polymer, (b) 5 to 80% by weight, more preferably 15 to 60% by weight of an ethylenically unsaturated compound, (c) 0.1 to 15% by weight, more preferably 2.0 to 10.0% by weight of a radical generator and (a) 0.1 to 15% by weight, more preferably 0.2 to 10.0% by weight of a sensitizer, or a composition comprising (a') 100% by weight of an ethylenically unsaturated compound, (b') 0.1 to 15% by weight, more preferably 2.0 to 10.0% by weight of a radical generator and (c') 0.1 to 15% by weight, more preferably 0.2 to 10.0% by weight of a sensitizer. The above-mentioned composition can be used in the form of a liquid composition wherein use is made of a solvent or a composition in a dry film form prepared by coating the composition to form a film. If necessary, conventional additives, such as a polymerization inhibitor and a levelling agent, may also be incorporated.

The present invention will now be described in more detail with reference to embodiments shown in the drawings.

Figure 2:
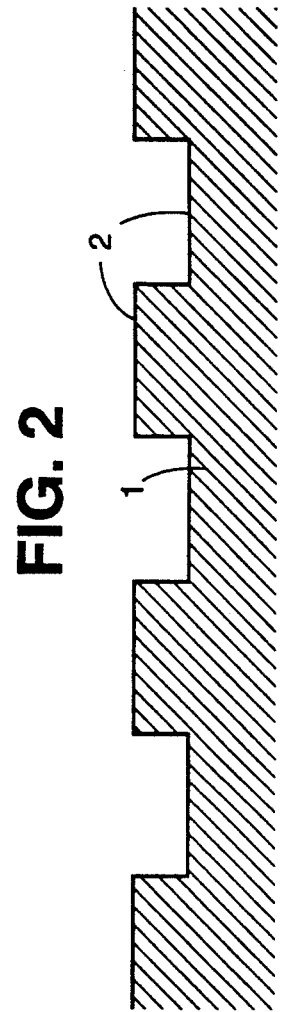
FIG. 2 is a typical diagram showing an embodiment of an uneven pattern formed on the surface of a work roll according to the present invention.

FIG. 1 shows an embodiment of the step for processing the surface of a work roll according to the present invention, and FIG. 2 is a typical diagram showing an uneven pattern 2 formed on the surface of a roll 1 according to the step for processing the surface of the roll shown in FIG. 1.

The formation of the uneven pattern 2 on the surface of the roll 1 can be effected, for example, by a method as shown in FIGS. 1 (a) to (d). Specifically, at the outset, a visible light curable photosensitive composition 4 is fed into a photosensitive resin composition feeder 6 through a hopper 3 provided on the top of the photosensitive resin composition feeder 6, and the visible light curable photosensitive resin composition 4 is coated on the surface of the roll 1, while regulating the thickness of the coating by means of air 5 blown from the rear of the feeder 6 to form a visible light curable photosensitive resin composition layer 7 on the surface of the roll 1. Then, as shown in FIG. 1 (b), the visible light curable photosensitive resin composition layer 7 is irradiated with a laser beam 9 having a wavelength in a visible region emitted from a laser beam source 8 in an intermittent manner at a regular pitch to cure exposed portions 12.

In the embodiment shown in FIG. 1 (b), use is made of a chopper 11 having a slit 10, and intermittent irradiation with the beam 9 is effected while rotating the chopper. The method of effecting intermittent irradiation is not limited to this only. For example, the intermittent irradiation may be effected also by means of deflection control of, for example, a continuously irradiated laser beam, a pulsed laser. Subsequently, as shown in FIG. 1 (c), the treated surface of the roll is sprayed with a detergent 14, for example, 1,1,1-trichloroethane, through a sprayer 13. As a result, as shown in FIG. 1 (d), the cured portion 12 of the resin composition remains unremoved, and the uncured portion alone is washed away, so that the surface 15 of the roll 1 is exposed.

Thereafter, etching is effected with chemical etchants, such as copper chloride, iron chloride, sulfuric acid and nitric acid, either alone or in combination thereof, to form a recessed portion. Further, the cured portion 12 is washed away with a suitable solvent to form a regular uneven pattern 2 as shown in FIG. 2.

In the present embodiment, although etching is adopted as means for forming an uneven pattern on the surface of the roll, the present invention is not limited to this treatment method only. For example, use may be made of treatment methods such as plating, vapor deposition and dry etching.

The present invention will now be described in more detail with reference to, but is by no means limited to, the following Examples.

EXAMPLES 1 to 3

Preparation of Visible Light Curing Photosensitive Resin Composition

The following compounds were mixed with each other according to the following formulation to prepare visible light curable photosensitive resin composition Nos. 1 to 3. The radical generators and sensitizers were used, in combinations, as specified in Table 1.

| | |
|---|---|
| Methyl methacrylate/hydroxyethyl acrylate copolymer (weight ratio = 85/15, number average molecular weight = 100,000) | 55 parts by weight |
| Trimethylolpropane triacrylate | 20 parts by weight |
| Tetraethylene glycol diacrylate | 10 parts by weight |

-continued

| | |
|---|---|
| Butoxylated methylolamine | 10 parts by weight |
| Radical generator | 2.5 parts by weight |
| Sensitizer | 2.5 parts by weight |
| Hydroquinone | 0.1 part by weight |
| Methyl ethyl ketone | 150 parts by weight |

TABLE 1

| No. | Radical Generator | Sensitizing Agent |
|---|---|---|
| 1 | BTTB | Coumarin |
| 2 | BTTB | Cyanine |
| 3 | Triazine | Coumarin |

Note
BTTB: 3,3',4,4'-tetra(tert-butylperoxycarbonyl)benzophenone
Coumarin: 3,3'-carbonylbis(7-diethylaminocoumarin)
Cyanine: 1,1-bis-(3-ethyl-3-benzothiazole)methinecyanine
Triazine: 2,4,6-tris(trichloromethyl)-s-triazine As shown in FIG. 1 (a), the visible light curable photosensitive resin composition 4 contained in the hopper 3 was spray-coated through a nozzle 6 for blowing a compressed air 5, while rotating the work roll 1 to form a visible light curable photosensitive resin composition coating 7 having a homogeneous thickness. Then, as shown in FIG. 1 (b), a chopper 11 provided with a slit 10 was placed between the laser beam source 8 and the work roll 1, and the visible light curable photosensitive resin composition coating was intermittently irradiated with a visible light laser 9 having a wavelength of 488 nm to form a cured product 12 of the visible light curable photosensitive resin composition at the exposed portion. Thereafter, 1,1,1-trichloroethane 14 was sprayed by means of a sprayer 13 to wash away the visible light curable photosensitive resin composition at the unexposed portion to expose the surface 15 of the roll 1. The work roll surface 15 exposed by the above-mentioned procedure was etched with an etchant to a predetermined depth. Then, methylene chloride was sprayed by means of a sprayer 13 to remove the cured visible light curable photosensitive resin composition 12. Thus, a work roll having a regular uneven pattern formed thereon was prepared.

COMPARATIVE EXAMPLES 1 to 6

Preparation of Ultraviolet Curing Photosensitive Resin Composition

Ultraviolet curing photosensitive resin composition Nos. 4 to 6 were prepared in the same manner as that of Example 1, except that 2.5 parts by weight of a photopolymerization initiator capable of generating radicals upon being exposed to ultraviolet rays as provided in Table 2 was used, instead of the radical generators and sensitizers provided in Table 1.

TABLE 2

| No. | Photopolymerization Initiator |
|---|---|
| 4 | Benzophenone |
| 5 | Irgacure 651 |
| 6 | Darcure 1173 |

Note
Irgacure 651: benzyl dimethyl ketal (manufactured by Ciba-Geigy Limited)
Darocure 1173: 2-hydroxy-2-methylpropiophenone (manufactured by Merck)

Surface Processing of Work Roll

The surface processing of a work roll was effected in the same manner as that of Example 1, except that an ultraviolet laser having wavelengths of 351 nm and 363 nm was used, instead of the visible light laser having a wavelength of 488 nm and use was made of photosensitive resin composition Nos. 1 to 6.

The results of evaluation of the method for processing the surface of the work roll are provided in Table 3. As is apparent from Table 3, the method according to the present invention is capable of obtaining a good surface property in a short time.

TABLE 3

| No. | Configuration*1 | Curing Time (msec)*2 |
|---|---|---|
| Ex. | | |
| 1 | ○ | 0.1 |
| 2 | ○ | 0.1 |
| 3 | ○ | 0.2 |
| Comp. Ex. | | |
| 1 | X | 1000 or more |
| 2 | X | 1000 or more |
| 3 | X | 1000 or more |
| 4 | Δ | 50 |
| 5 | Δ | 12 |
| 6 | Δ | 12 |

Note
*1: Evaluation of configuration
The protruded portion of the surface of the roll as processed was observed under a microscope and evaluated according to the following criteria.
○: A protruded portion having a predetermined size could be formed.
Δ: Although a protruded portion having a predetermined size could be formed, it had double image.
X: The composition did not cured, and no protruded portion was formed.
*2: Curing time Laser irradiation time necessary for the visible light curable photosensitive resin composition having a thickness of 7 μm to be cured was measured and regarded as the curing time.

As mentioned above, the present invention provides a method for processing the surface of a work roll, comprising forming a pattern coated with a cured product of a photosensitive resin composition on the surface of a work roll only at its predetermined portion, chemically etching the surface of the work roll at its remaining uncoated portions and peeling the cured product to form an uneven pattern on the surface of the work roll, wherein use is made of a visible light curable photosensitive resin composition curable upon being exposed to a light in a visible region. This constitution can shorten the time necessary for the work roll to be worked and enables an inexpensive work roll to be used, which renders the method of the present invention very useful from a practical point of view. Further, since the visible light curable photosensitive resin composition is cured upon being exposed to light in a visible region at an energy of 0.2 to 0.5 mJ/cm$^2$, when curing is effected at 0.2 mJ/cm$^2$, that is, the minimum photosensitive energy, the exposure time may be as short as 0.1 msec as opposed to an ultraviolet curable photosensitive resin composition.

We claim:
1. A method for processing the surface of a work roll, comprising coating the surface of a work roll at a predetermined portion thereof with a cured product of a photosensitive resin composition to form a pattern and chemically etching the surface of the pressure roll at the remaining uncoated portions and peeling the cured product to process the surface of the pressure roll, wherein said composition comprises a visible light curable photosensitive resin composition and is cured by visible light irradiation.
2. A method as claimed in claim 1, wherein said composition comprises a binder polymer, an ethylenically unsaturated compound, a radical generator and a sensitizer.

3. A method as claimed in claim 2, wherein said composition comprises 5 to 80% by weight of the binder polymer, 5 to 80% by weight of the ethylenically unsaturated compound, 0.1 to 15% by weight of the radical generator and 0.1 to 15% by weight of the sensitizer.

4. A method as claimed in claim 1, wherein said composition comprises a visible light curable photosensitive resin composition composed of an ethylenically unsaturated compound, a radical generator and a sensitizer.

5. A method as claimed in claim 4, wherein said composition comprises 100% by weight of the ethylenically unsaturated compound, 0.1 to 15% by weight of the radical generator and 0.1 to 15% by weight of the sensitizer.

* * * * *